(12) United States Patent
Hoshi et al.

(10) Patent No.: US 9,818,856 B2
(45) Date of Patent: Nov. 14, 2017

(54) SEMICONDUCTOR DEVICE WITH HIGH ELECTRON MOBILITY TRANSISTOR

(71) Applicant: DENSO CORPORATION, Kariya, Aichi-pref. (JP)

(72) Inventors: Shinichi Hoshi, Okazaki (JP); Shoji Mizuno, Okazaki (JP); Tetsu Kachi, Nisshin (JP); Tsutomu Uesugi, Seto (JP); Kazuyoshi Tomita, Nagoya (JP); Kenji Ito, Nagoya (JP)

(73) Assignee: DENSO CORPORATION, Kariya (JP)

( * ) Notice: Subject to any disclaimer, the term of this patent is extended or adjusted under 35 U.S.C. 154(b) by 44 days.

(21) Appl. No.: 14/347,863

(22) PCT Filed: Oct. 17, 2012

(86) PCT No.: PCT/JP2012/006623
§ 371 (c)(1),
(2) Date: Mar. 27, 2014

(87) PCT Pub. No.: WO2013/065243
PCT Pub. Date: May 10, 2013

(65) Prior Publication Data
US 2014/0231874 A1 Aug. 21, 2014

(30) Foreign Application Priority Data

Oct. 31, 2011 (JP) .................................. 2011-239044

(51) Int. Cl.
*H01L 27/06* (2006.01)
*H01L 29/20* (2006.01)
(Continued)

(52) U.S. Cl.
CPC .... *H01L 29/7787* (2013.01); *H01L 21/76224* (2013.01); *H01L 29/66462* (2013.01);
(Continued)

(58) Field of Classification Search
CPC ........... H01L 29/7787; H01L 29/66462; H01L 21/76224; H01L 29/7786; H01L 29/861; H01L 29/2003; H01L 29/0649
(Continued)

(56) References Cited

U.S. PATENT DOCUMENTS 8,003,452 B2 * 8/2011 Ohki ................. H01L 29/41758
257/76
2002/0018328 A1 * 2/2002 Nakamura ....... H03K 17/08122
361/91.5
(Continued)

FOREIGN PATENT DOCUMENTS

JP H07-263465 A 10/1995
JP 2000-200902 A 7/2000
(Continued)

OTHER PUBLICATIONS

International Search Report and Written Opinion of the International Searching Authority dated Jan. 15, 2013 for the corresponding international application No. PCT/JP2012/006623 (with English translation).
(Continued)

*Primary Examiner* — Marcos D Pizarro
*Assistant Examiner* — Nelson Garces
(74) *Attorney, Agent, or Firm* — Posz Law Group, PLC

(57) ABSTRACT

A semiconductor device includes a HEMT and a diode. The HEMT includes: a substrate having a GaN layer as a channel layer generating a two-dimensional electron gas and an AlGaN layer as a barrier layer on the GaN layer; a source electrode on the AlGaN layer ohmic contacting the AlGaN layer; a drain electrode on the AlGaN layer apart from the source electrode and ohmic contacting the AlGaN layer; an inter-layer insulating film on the AlGaN layer between the source electrode and the drain electrode; and a gate electrode
(Continued)

on the inter-layer insulating film. The substrate includes an active layer region generating the two dimensional electron gas in the GaN layer. The diode includes an anode electrically connected to the gate electrode and a cathode electrically connected to the drain electrode.

18 Claims, 4 Drawing Sheets

(51) Int. Cl.
| | |
|---|---|
| *H01L 21/8234* | (2006.01) |
| *H01L 29/16* | (2006.01) |
| *H01L 21/388* | (2006.01) |
| *H01L 29/15* | (2006.01) |
| *H01H 3/20* | (2006.01) |
| *H01L 27/07* | (2006.01) |
| *H01L 29/74* | (2006.01) |
| *H01L 29/778* | (2006.01) |
| *H01L 29/66* | (2006.01) |
| *H01L 21/762* | (2006.01) |
| *H01L 29/861* | (2006.01) |
| *H01L 29/06* | (2006.01) |

(52) U.S. Cl.
CPC ...... *H01L 29/7786* (2013.01); *H01L 29/0649* (2013.01); *H01L 29/2003* (2013.01); *H01L 29/861* (2013.01)

(58) Field of Classification Search
USPC .................................................. 257/190–200
See application file for complete search history.

(56) References Cited

U.S. PATENT DOCUMENTS

| | | | |
|---|---|---|---|
| 2004/0248330 A1 | 12/2004 | Kitabatake et al. | |
| 2007/0023779 A1* | 2/2007 | Hirose | H01L 27/0255 257/173 |
| 2008/0062595 A1 | 3/2008 | Ping et al. | |
| 2008/0191216 A1 | 8/2008 | Machida et al. | |
| 2008/0258224 A1* | 10/2008 | Hshieh | H01L 27/0255 257/356 |
| 2009/0166677 A1 | 7/2009 | Shibata et al. | |
| 2009/0167411 A1* | 7/2009 | Machida | H01L 27/0605 327/427 |
| 2011/0193171 A1 | 8/2011 | Yamagiwa et al. | |
| 2011/0204381 A1 | 8/2011 | Okada et al. | |
| 2011/0210338 A1* | 9/2011 | Briere | H01L 27/0605 257/76 |
| 2012/0228632 A1* | 9/2012 | Takada | H01L 21/8213 257/77 |
| 2014/0367700 A1* | 12/2014 | Prechtl | H01L 27/0605 257/76 |

FOREIGN PATENT DOCUMENTS

| | | |
|---|---|---|
| JP | 2004-186558 A | 7/2004 |
| JP | 2007-215389 A | 8/2007 |
| JP | 2009-246276 A | 10/2009 |

OTHER PUBLICATIONS

Wataru Saito et al., "High Breakdown Voltage AlGaN—GaN Power-HEMT Design and High Current Density Switching Behavior" IEEE Transactions on Electron Devices, vol. 50, No. 12, Dec. 2003, pp. 2525-2529.

* cited by examiner

SEMICONDUCTOR DEVICE WITH HIGH ELECTRON MOBILITY TRANSISTOR

CROSS REFERENCE TO RELATED APPLICATION

The present disclosure is a U.S. national stage application of PCT/JP2012/006623 filed on Oct. 17, 2012 and is based on Japanese Patent Application No. 2011-239044 filed on Oct. 31, 2011, the contents of which are incorporated herein by reference.

TECHNICAL FIELD

The present disclosure relates to a semiconductor device including a structure of a high electron mobility transistor (HEMT) based on gallium nitride (GaN) and a manufacturing method thereof.

BACKGROUND ART

Nitride semiconductors represented by gallium nitride (GaN) are semiconductors having an extremely broad band gap, and GaN and AlN have band gaps as broad as 3.4 eV and 6.2 eV, respectively. Further, GaN has characteristics that a breakdown field and a saturated drift velocity of electrons are two or three times greater than those of the other semiconductors, such as GaAs and Si.

Also, nitride semiconductors form multi-element mixed crystal semiconductors with the use of aluminum (Al) and indium (In) and a heterostructure can be designed by laminating semiconductors having different band gaps. For example, it is known that an extremely high sheet carrier concentration of $1.0 \times 10^{13}$ cm$^{-2}$ or higher can be obtained in a C-axis direction from spontaneous polarization and piezo-electric polarization generated by deformation resulting from lattice mismatch on a hetero interface of aluminum gallium nitride and gallium nitride having an Al composition ratio of 25%. This HEMT of AlGaN/GaN using a highly-concentrated two dimensional electron gas (2DEG) shows an extremely large and high driving capability, which is ten times greater than that of Si-based devices and about four times greater than that of a 2DEG based on AlGaAs/GaAs of the same compound semiconductor. Further, owing to the high capability of the material, nitride semiconductors realize on-resistance as low as or lower than 1/10 that of a MOSFET (Metal-Oxide Semiconductor Field-Effect Transistor) using Si and 1/3 that of an IGBT (Insulated Gate Bipolar Transistor) in a device having an on-resistance and a withstand voltage of 200 V as an element limit (for example, see NPL 1).

However, when the GaN-HEMT is applied to a power supply with an inductive load, an inverter having an inductive load motor, and the like, there are problems as follows.

In a case where an inductive load is connected to the HEMT, it is necessary to consume energy accumulated in the inductive load within the circuit when the HEMT is turned OFF. Herein, energy is expressed as: $E=(½) \times LI^2$, where L is self-inductance and I is a current. A MOSFET using Si has an anti-parallel parasitic diode connected between the drain and the source in a device structure. The cathode of the parasitic diode is connected to the drain and the anode is connected to the source. When the MOSFET is turned OFF, energy from the inductive load can be consumed using an avalanche region of the parasitic diode. The MOSFET therefore has relatively large avalanche energy resistance.

The avalanche energy resistance is an index of disruption endurance of a device, and is defined as maximum energy that can be consumed without causing disruption of the device when energy accumulated in the inductive load is consumed by the device.

On the other hand, a field effect transistor device of a compound semiconductor, such as a GaN-HEMT and a GaAs-HEMT, generally does not have a P region and therefore does not have a parasitic diode structure. Hence, energy from the inductive load cannot be consumed within the element and the energy exceeds a gate-drain withstand voltage (BVgd) and a source-drain OFF withstand voltage (BVdsoff) and eventually gives rise to an element disruption. Accordingly, it is general to use the HEMT with a protection element in a system of an inductive load having self-inductance L, such as an inverter.

FIG. 10A and FIG. 10B are views showing examples of a protection element connection. FIG. 10A shows an example where a diode is connected between the source and the drain. FIG. 10B shows an example where a diode is connected between the gate and the drain and between the gate and the source.

The connection configuration shown in FIG. 10A is described, for example, in JP-A-2009-164158. This connection configuration, however, has a drawback that the protection element occupies a large area because the diode requires a current capacity equal to a rated current of the MOSFET.

Also, the connection configuration shown in FIG. 10B has not been proposed for a GaN-HEMT. This connection configuration is, however, equivalent to a protection circuit of an IGBT element. A mechanism of this connection configuration is as follows. That is, when a gate-drain voltage rises, a zener diode between the gate and the drain starts to operate and the diode between the gate and the source starts to operate at the same time. Hence, a gate voltage is lifted up and the channel is opened, so that avalanche energy is released.

This connection configuration is of the mechanism by which when a drain voltage is increased by energy in the inductive load connected to the IGBT element, the channel is opened by modifying the drain voltage and transmitting the modified drain voltage to the gate voltage, so that avalanche energy is released. This connection configuration therefore has an advantage that a large protection element is not required.

Such being the case, a diode may be provided to a GaN-HEMT as a protection element as with an IGBT element. However, because the protection element of an IGBT element is formed of an Si diode, it is natural to form, for example, polysilicon to be formed into a diode on a GaN layer in the same manner. Because a GaN layer is semi-insulating, a polysilicon layer can be directly formed on the GaN layer. However, silicon goes into the GaN layer and becomes a dopant. In order to avoid this inconvenience, a polysilicon layer is formed directly on the GaN layer via an insulating layer. In this case, a parasitic capacity is undesirably formed by the GaN layer, the insulating layer, and the polysilicon layer.

As has been described above, it is difficult to provide a diode structure to a GaN-HEMT and a protection diode structure suitable to a GaN-HEMT has not been proposed to date.

PRIOR ART LITERATURES

Non Patent Literature

[Non Patent Literature 1]
W. Saito, et al., "High Breakdown Voltage AlGaN—GaN Power-HEMT Design and High Current Density Switching Behavior", IEEE Transactions on Electron Devices, Vol. 50, No. 12, pp. 2528-2531, 2003

SUMMARY OF INVENTION

It is a first object of the present disclosure to provide a semiconductor device including a diode structure to protect a HEMT based on gallium nitride (GaN), and it is also a second object to provide a manufacturing method thereof.

According to a first aspect of the present disclosure, a semiconductor device includes: a high electron mobility transistor; and a diode. The high electron mobility transistor includes a substrate having a gallium nitride layer for generating a two-dimensional electron gas therein and for functioning as a channel layer and an aluminum gallium nitride layer stacked on the gallium nitride layer and functioning as a barrier layer, a source electrode arranged on the aluminum gallium nitride layer and ohmic contacting the aluminum gallium nitride layer, a drain electrode arranged on the aluminum gallium nitride layer apart from the source electrode, and ohmic contacting the aluminum gallium nitride layer, an inter-layer insulating film disposed on the aluminum gallium nitride layer between the source electrode and the drain electrode, and a gate electrode disposed on the inter-layer insulating film. The substrate includes an activation layer region for generating the two-dimensional electron gas in the gallium nitride layer. The diode includes an anode electrically connected to the gate electrode and a cathode electrically connected to the drain electrode. The diode provides a gate-drain diode.

In the semiconductor device described above, a voltage of the drain electrode can be transmitted to the gate electrode by the gate-drain diode. Hence, energy can be flown through a channel in a high electron mobility transistor based on gallium nitride. It thus becomes possible to protect the high electron mobility transistor based on gallium nitride by the diode.

According to a second aspect of the present disclosure, a manufacturing method of the semiconductor device according to the first aspect of the present disclosure includes: preparing the substrate; forming an element isolation region electrically isolated from the activation layer region at least in a part of the substrate other than the activation layer region; forming the high electron mobility transistor in the activation layer region of the substrate and forming a gate-drain diode having an anode connected to the gate electrode and a cathode connected to the drain electrode in the element isolation region.

With the manufacturing method described above, it becomes possible to obtain a semiconductor device in which a diode is incorporated in a high electron mobility transistor based on gallium nitride.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Hereinafter, embodiments of the present disclosure will be described according to the drawings. An N-type referred to in the respective embodiments below corresponds to a first conductivity type of the present disclosure and a P-type corresponds to a second conductivity type of the present disclosure.

First Embodiment

Figure 1:
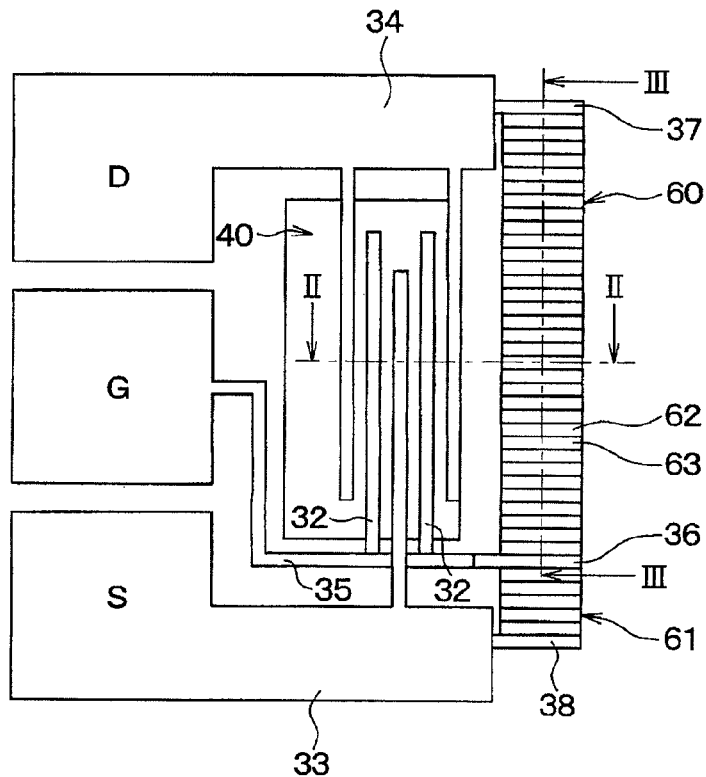
FIG. 1 is a plan view of a semiconductor device of a first embodiment.
Figure 2:
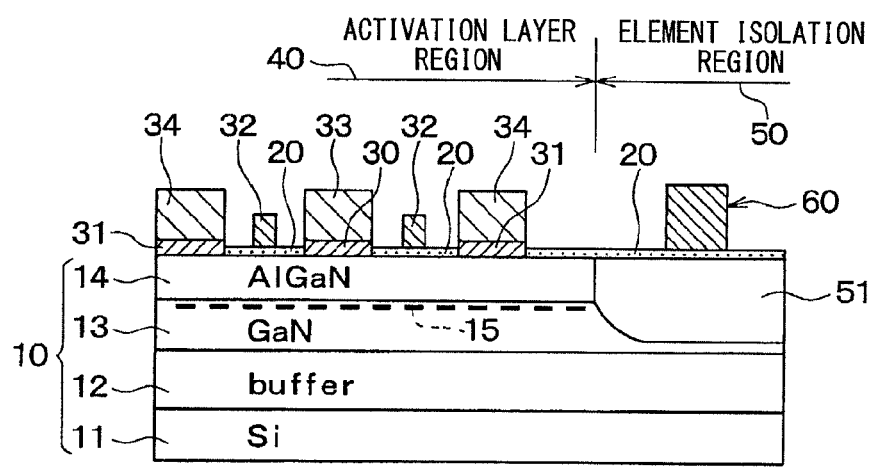
FIG. 2 is a cross section taken along the line II-II of FIG. 1.
Figure 3:
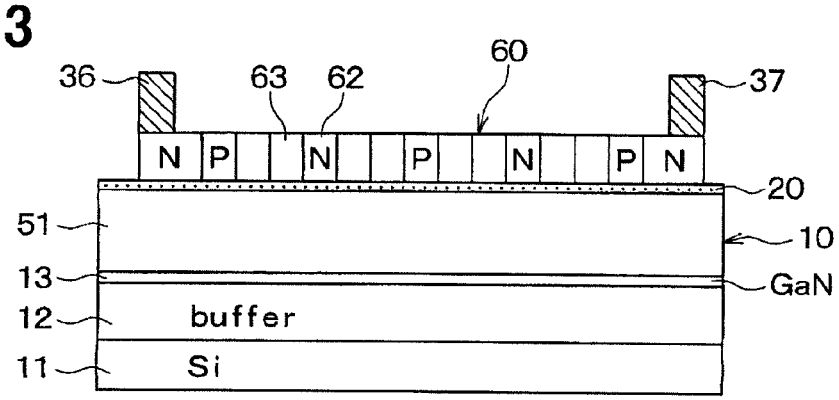
FIG. 3 is a cross section taken along the line III-III of FIG. 1.

FIG. 1 is a plan view of a semiconductor device of this embodiment. Also, FIG. 2 is a cross section taken along the line II-II of FIG. 1 and FIG. 3 is a cross section taken along the line of FIG. 1. A configuration of the semiconductor device of this embodiment will be described with reference to FIG. 1 through FIG. 3.

Firstly, the semiconductor device of this embodiment includes a high electron mobility transistor based on gallium nitride (hereinafter, referred to as the GaN-HEMT).

As is shown in FIG. 2, the GaN-HEMT is formed on a substrate 10 formed by sequentially laminating a supporting substrate 11, a buffer layer 12, a gallium nitride layer 13 (hereinafter, referred to as the GaN layer 13), and an aluminum gallium nitride layer 14 (hereinafter, referred to as the AlGaN layer 14).

The supporting substrate 11 is, for example, a single crystal Si substrate. The buffer layer 12 is a compound layer to make a lattice constant of the supporting substrate 11 and a lattice constant of the GaN layer 13 coincide with each other. A thickness of the buffer layer 12 is, for example, 1 μm to 2 μm.

The GaN layer 13 is a channel layer that generates a two dimensional electron gas and laminated on the buffer layer 12. When a two dimensional electron gas is generated in the GaN layer 13, a two dimensional electron gas layer 15 is formed. A thickness of the GaN layer 13 is, for example, 1 μm.

The AlGaN layer 14 is a barrier layer to serve as a barrier to electrons in the channel layer and laminated on the GaN layer 13. A thickness of the AlGaN layer 14 is, for example, 20 nm.

An inter-layer insulating film 20 having a thickness of about 100 nm is formed on the surface of the substrate 10 having the lamination structure as above, that is, on the surface of the AlGaN layer 14.

A part of the inter-layer insulating film 20 is opened and a source electrode 30 and drain electrodes 31 spaced apart from the source electrode 30 are formed in this opening portion. The inter-layer insulating film 20 is opened along one direction parallel to a plane direction on the surface of the substrate 10 and the source electrode 30 and the drain electrodes 31 are provided so as to extend in this opening portion. Hence, the source electrode 30 and the drain electrodes 31 are provided on the AlGaN layer 14.

Because the source electrode 30 and the drain electrodes 31 are spaced apart, the inter-layer insulating film 20 is naturally provided on the AlGaN layer 14 between the source electrode 30 and the drain electrodes 31.

The source electrode 30 and the drain electrodes 31 are ohmic metal in ohmic contact with the AlGaN layer 14. For example, a Ti/Al layer is formed as ohmic metal.

Also, gate electrodes 32 are formed on the inter-layer insulating film 20 between the source electrode 30 and the drain electrodes 31 along the one direction specified above. The gate electrodes 32 are, for example, Schottky electrodes made of Ni.

Hence, as is shown in FIG. 2, a single source electrode 30 is disposed between two drain electrodes 31. One gate electrode 32 is disposed between one drain electrode 31 and the source electrode 30. Also, the other gate electrode 32 is disposed between the other drain electrode 31 and the source electrode 30.

In the configuration above, of the substrate 10, a region of the two dimensional electron gas layer 15 in which a two dimensional electron gas is generated in the GaN layer 13 functions as an active layer region 40. In other words, the active layer region 40 is an active region in which the GaN-HEMT operates. As is shown in FIG. 1, the active layer region 40 is defined in a rectangular shape.

On the other hand, at least a part of regions of the substrate 10 except for the active layer region 40 is an element isolation region 50 electrically isolated from the active layer region 40. In this embodiment, all of the regions except for the active layer region 40 form the element isolation region 50.

In the element isolation region 50, an element isolation layer 51 is formed in the GaN layer 13 and the AlGaN layer 14 by ion implantation of Ar ions or N ions into the GaN layer 13 and the AlGaN layer 14 in the element isolation region 50. The element isolation region 50 is thus electrically isolated from the active layer region 40. As is shown in FIG. 2, a depth of the ion implantation in the substrate 10 is as deep as to reach the GaN layer 13. More specifically, ions are implanted deeper than the two dimensional electron gas layer 15 in the GaN layer 13. The element isolation region 50 is therefore a region in which the GaN-HEMT is prevented from operating by ion implantation.

As is shown in FIG. 2, a source lead line 33 is provided on the source electrode 30. As is shown in FIG. 1, the source lead line 33 is extended in one direction along the extension direction of the source electrode 30 and routed in one direction along a direction perpendicular to the extension direction of the source electrode 30 on the inter-layer insulating film 20 while an end portion is laid out in the form of a pad.

Also, as is shown in FIG. 2, a drain lead line 34 is provided on the drain electrodes 31. As is shown in FIG. 1, the drain lead line 34 is extended in the other direction along the extension direction of the source electrode 30 and routed in one direction along a direction perpendicular to the extension direction of the source electrode 30 on the inter-layer insulating film 20 while an end portion is laid out in the form of a pad.

As is shown in FIG. 1, the gate electrodes 32 are connected to a gate lead line 35. The gate lead line 35 is extended in the other direction along the extension direction of the source electrode 30 and routed in one direction along a direction perpendicular to the extension direction of the source electrode 30 on the inter-layer insulating film 20 while an end portion is laid out in the form of a pad. The gate pad is disposed between the drain pad and the source pad. In other words, the gate electrodes 32 are electrodes formed in the same step as the source lead line 33 and the drain lead line 34 and a part thereof functions as a line. The respective pads are electrically connected to an unillustrated outside circuit via wires or the like.

A gate-drain diode 60, the anode of which is electrically connected to the gate electrodes 32 and the cathode of which is electrically connected to the drain electrodes 31, is provided on the substrate 10. Also, a gate-source diode 61, the anode of which is electrically connected to the source electrode 30 and the cathode of which is electrically connected to the gate electrodes 32, is provided on the substrate 10.

These diodes 60 and 61 are disposed on the substrate 10 in the element isolation region 50 electrically isolated from the active layer region 40. More specifically, the respective diodes 60 and 61 are disposed on the inter-layer insulating film 20 positioned in the other direction along a direction perpendicular to the extension direction of the source electrode 30.

As is shown in FIG. 1, the respective diodes 60 and 61 are formed of electrical connections in which N-type layers 62 and P-type layers 63 made of polysilicon are disposed alternately. The N-type layers 62 and the P-type layers 63 are disposed alternately in a repetitive manner along the extension direction of the source electrode 30.

The anode of the gate-drain diode 60 is electrically connected to the gate electrodes 32 via a first lead line 36 extended from the gate lead line 35. Also, the cathode of the gate-drain diode 60 is electrically connected to the drain electrodes 31 via a second lead line 37 extended from the drain lead line 34.

Also, as is shown in FIG. 2, ends of the first lead line 36 and the second lead line 37 are disposed on polysilicon forming the diode 60. In this manner, the lead lines of the diode 60 adopted herein are not a Ti/Al electrode same as the source electrode 30 and the drain electrodes 31 but the lead lines lying above, that is, the lines same as the gate electrodes 32, and the reason for this configuration is as follows.

As has been described above, an ohmic material of the GaN-HEMT is generally a Ti/Al electrode. Ohmic metal is formed by sinter-annealing TVA at approximately 600° C. On the other hand, polysilicon and Al turn to silicide at approximately 600° C. Such being the case, extending an electrode for the diode 60 using ohmic metal of the GaN-HEMT poses a problem in terms of heat history. Hence, because the Ti/Al electrode cannot be brought into contact with polysilicon forming the diode 60, the polysilicon lead electrodes are the line layer same as the source lead line 33 and the drain lead lines 34 lying above the source electrode 30 and the drain electrodes 31, respectively.

Also, the anode of the gate-source diode 61 is electrically connected to the source electrode 30 via a third lead line 38 extended from the source lead line 33. Also, the cathode of the gate-source diode 61 is electrically connected to the gate electrodes 32 via the first lead line 36 extended from the gate lead line 35.

The third lead line 38 relating to the gate-source diode 61 is not the Ti/Al electrode but the same line layer as the source lead line 33 for the same reason described above.

A withstand voltage of the gate-drain diode 60 will now be described. For example, in the case of a GaN-HEMT having a withstand voltage of 600 V, it is generally designed in such a manner that a polysilicon diode turns ON at a voltage slightly lower than the gate-drain withstand voltage (BVgd). Herein, assume that the polysilicon diode turns ON at a voltage of 500 V. Because a zener voltage (reverse voltage) of polysilicon per step is 5 V to 6 V, the diode 60 having 83 to 100 steps is required for a voltage of 500 V.

Such a high voltage is applied to the diode 60 operating between the gate and the drain. It thus becomes necessary to suppress leaking or breakdown while the diode is in operation. In a case where the polysilicon diode 60 is formed on the active layer of the GaN-HEMT channel, a thickness of an insulating film (film thickness of the inter-layer insulating film 20) necessary for breakdown with a channel or an electrode is extremely increased and reaches as thick as 10 μm with $SiO_2$ and SiN. Generally, the insulating film (inter-layer insulating film 20) on the GaN-HEMT is 1-μm thick or thinner and the process matching becomes extremely poor.

In a case where the polysilicon diode 60 is formed on the element isolation region 50, the isolation layer lying underneath serves as a breakdown suppression layer and a film thickness necessary for breakdown becomes substantially 0 for the reason as follows. That is, the GaN-HEMT element is formed of a GaN epilayer on a low-resistance (111) Si substrate and an Si substrate electrode is used as the source electrode. Accordingly, a source-drain withstand voltage depends on a thickness of the GaN layer. This is because it is the GaN epilayer that has a withstand voltage necessary to operate the original GaN-HEMT element at 600 V. Hence, the structure in which the polysilicon diode 60 is formed in the element isolation region 50 of the GaN-HEMT as described above becomes necessary.

Although it depends on a manufacturing method of polysilicon, in a case where Si diffuses into the GaN layer 13 at an annealing temperature (900° C.) necessary for impurity activation of polysilicon or the like and turns into a leak current factor, the inter-layer insulating film 20 between polysilicon and GaN is necessary as a diffusion preventing film. A thickness of about 100 nm is sufficient for this insulating film as described above.

Figure 10A:
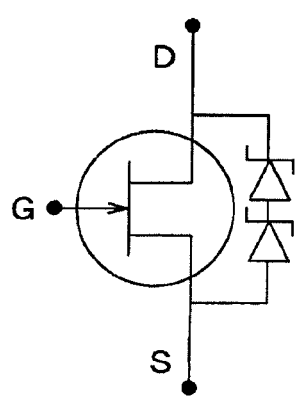
FIGS. 10A and 10B are views used to describe problems.
Figure 10B:
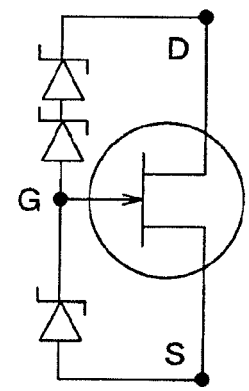

The above has described the overall configuration of the semiconductor device of this embodiment. The GaN-HEMT operates, for example, as a normally off type. FIG. 10B shows an equivalent circuit of the semiconductor device.

A method of manufacturing the semiconductor device of the structure described above will now be described. Initially, the substrate 10 having the AlGaN layer 14 formed on the GaN layer 13 is prepared.

Subsequently, the element isolation region 50 is formed in this substrate 10. In this embodiment, Ar ions or N ions are implanted into the substrate 10 by ion implantation using a mask. Herein, a peak depth of the ion implantation is as deep as to reach the two dimensional electron gas layer 15, which is a 2DEG. Accordingly, of the substrate 10, the region to which the ion implantation is applied becomes the element isolation region 50 and the region to which the ion implantation is not applied becomes the activation layer region 40.

Thereafter, the 100-μm-thick inter-layer insulating film 20 is formed on the substrate 10, that is, on the AlGaN layer 14.

Also, an opening portion is provided to the inter-layer insulating film 20 positioned in the activation layer region 40, and patterning is performed by forming a Ti/Al layer by vapor deposition. Then, the source electrode 30 and the drain electrodes 31, which are ohmic metal, are formed by performing ohmic annealing at 600° C.

Also, the gate electrodes 32 are formed through patterning by forming an Ni layer on the inter-layer insulating film 20 by vapor deposition.

Subsequently, the gate-drain diode 60 and the gate-source diode 61 are formed on the inter-layer insulating film 20 in the element isolation region 50. More specifically, a polysilicon layer is formed on the inter-layer insulating film 20 and the N-type layers 62 and the P-type layers 63 of polysilicon are disposed alternately in a repetitive manner by applying ion implantation to this polysilicon layer. The number of steps of the diode 60 is set so as to suit the withstand voltage.

When the N-type layers 62 are formed, As (arsenic) is implanted by ion implantation under the conditions of 110 keV and $8 \times 10^{15}/cm^2$. Also, when the P-type layers 63 are formed, B (boron) is implanted by ion implantation under the conditions of 50 keV and $2 \times 10^{15}/cm^2$. Then, by activation-annealing polysilicon in $N_2$ atmosphere under the conditions of 900° C. and five minutes, the N-type layers 62 and the P-type layers 63 are formed.

Subsequently, the respective lines including the source lead line 33, the drain lead lines 34, the gate lead line 35, the first lead line 36, the second lead line 37, and the third lead line 38 are formed. A Ti/Al layer is formed as the respective lines and patterned as is shown in FIG. 1.

Hence, because the first through third lead lines 36 through 38 connected to the respective diodes 60 and 61 are not ohmic metal, even when the first through third lead lines 36 through 38 are formed on polysilicon forming the respective diodes 60 and 61, polysilicon does not turn to silicide. As has been described above, a GaN-HEMT incorporating the diodes 60 and 61 as protection elements is completed.

Operations of the respective diodes 60 and 61 will now be described. The gate-drain diode 60 transmits a voltage of the drain electrodes 31 to the gate electrodes 32. Because the GaN-HEMT starts to operate with this transmission, energy flows via the channel layer and it becomes possible to protect the GaN-HEMT. In other words, a current does not flow to the diode 60 as a protection element but flows to the GaN-HEMT. As described above, the diode 60 as a protection element only has to play a role as voltage transmitting means. Hence, there is an advantage that the diode 60 can be of a small size.

On the other hand, the gate-source diode 61 plays a role to flow a current, which has flown to the diode 60, to the source when a current is flown to the diode 60 between the gate and the source so that a driver circuit connected to the gate electrodes 32 is not influenced.

As has been described above, this embodiment is characterized in that the diodes 60 and 61 as protection elements of the GaN-HEMT are included in the element isolation region 50 provided to the substrate 10. In this manner, the diodes 60 and 61 are disposed to the substrate 10 in the element isolation region 50 different from a region in which the HEMT operates. It thus becomes possible to obtain a structure in which the single substrate 10 includes both of the GaN-HEMT and the protection elements. A structure in which the diode 60 is incorporated in the high electron mobility transistor based on gallium nitride can be obtained in this manner.

Also, the diodes 60 and 61 are disposed on the inter-layer insulating film 20 provided in the element isolation region 50. It thus becomes possible to prevent silicon, which is a material forming the diodes 60 and 61, from diffusing into the substrate 10 during activation annealing. Hence, the material forming the diodes 60 and 61, that is, silicon does not turn into a dopant in the substrate 10.

Herein, the N-type layers 62 correspond to "first conductivity type layers" and the P-type layers 63 correspond to "second conductivity type layers".

Second Embodiment

In this embodiment, a portion different from the first embodiment above will be described. In the first embodiment above, the element isolation region 50 electrically isolated from the activation layer region 40 is formed by ion implantation to the substrate 10. This embodiment is characterized in that the element isolation region 50 is formed not by ion implantation but by mesa etching.

Figure 4:
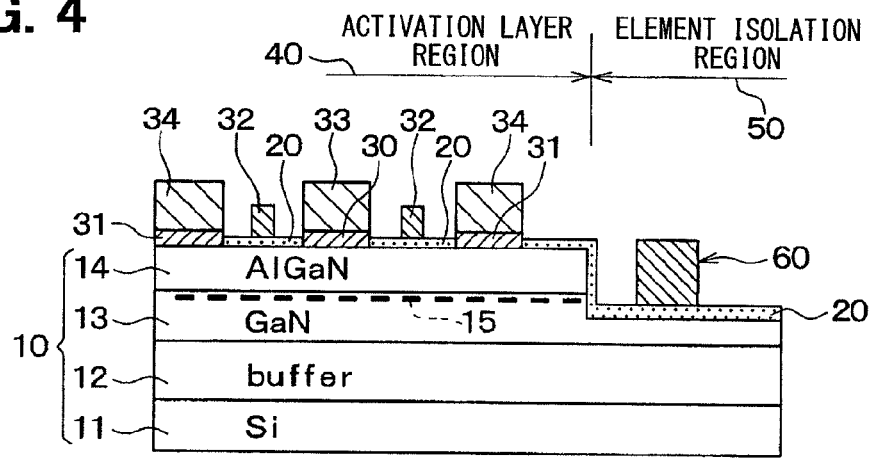
FIG. 4 is a cross section of a semiconductor device of a second embodiment.

FIG. 4 is a cross section of a semiconductor device of this embodiment and it is a view corresponding to the cross section taken along the line II-II of FIG. 1. As is shown in this drawing, in the element isolation region 50, a part of the GaN layer 13 and the AlGaN layer 14 in the element isolation region 50 are mesa-etched. In other words, it is a structure in which the periphery of the activation layer region 40 is removed by etching so that a portion forming the activation layer region 40 of the substrate 10 is left. Hence, the activation layer region 40 protrudes in a trapezoidal shape with respect to the element isolation region 50. The element isolation region 50 is thus electrically isolated from the activation layer region 40.

Regarding the element isolation region 50 of this embodiment, after the substrate 10 is prepared, a part of the GaN layer 13 and the AlGaN layer 14 positioned in the region to be formed into the element isolation region 50 of the substrate 10 are mesa-etched by dry etching using a mask. It thus becomes possible to form the element isolation region 50 electrically isolated from the activation layer region 40. The subsequent steps of forming the inter-layer insulating film 20 and so on are the same as those in the first embodiment above.

Third Embodiment

In this embodiment, a portion different from the first and second embodiments above will be described. This embodiment is characterized in that the element isolation region 50 is provided by removing the laminated structure on the supporting substrate 11 entirely except for the activation layer region 40.

Figure 5:
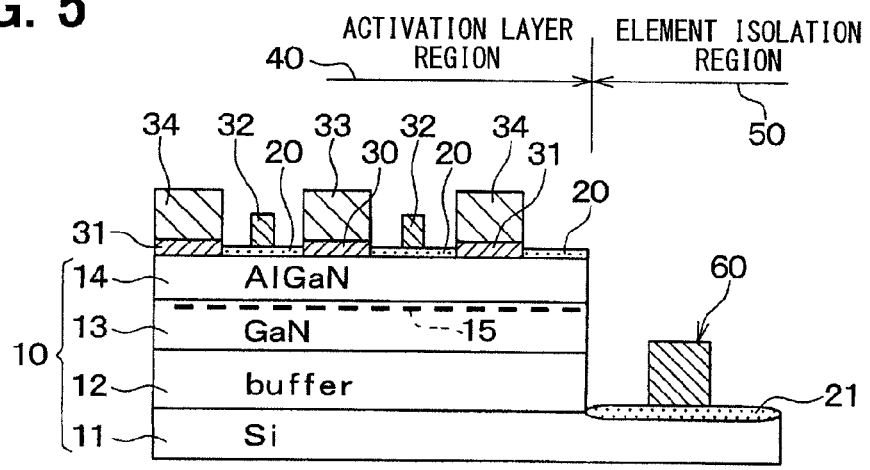
FIG. 5 is a cross section of a semiconductor device of a third embodiment.

FIG. 5 is a cross section of a semiconductor device of this embodiment and it is a view corresponding to the cross section taken along the line II-II of FIG. 1. As is shown in the drawing, in the element isolation region 50, the buffer layer 12, the GaN layer 13, and the AlGaN layer 14 positioned in the element isolation region 50 are removed entirely. The element isolation region 50 is thus electrically isolated from the active layer region 40.

The element isolation region 50 is provided with a LOCOS film 21 formed on the surface of the supporting substrate 11. A thickness of the LOCOS film 21 is, for example, 10 μm. The respective diodes 60 and 61 as protection elements are formed on this LOCOS film 21.

Hence, in the element isolation region 50 of this embodiment, after the substrate 10 is prepared, the buffer layer 12, the GaN layer 13, and the AlGaN layer 14 positioned in a region to be formed into the element isolation region 50 are removed entirely from the substrate 10. This can be an example of the mesa etching proposed in the second embodiment above. It thus becomes possible to form the element isolation region 50 electrically isolated from the activation layer region 40.

Thereafter, the inter-layer insulating film 20 is formed in the activation layer region 40 and the LOCOS film 21 is formed on the surface of the supporting substrate 11 in the element isolation region 50. A step of forming the inter-layer insulating film 20 and the LOCOS film 21 is an insulating film forming step. The subsequent steps, that is, the steps of forming the source electrode 30 and so on are the same as those in the first embodiment above.

It should be noted that the LOCOS film 21 corresponds to "the inter-layer insulating film".

Fourth Embodiment

In this embodiment, a portion different from the first through third embodiments above will be described. In the respective embodiments above, polysilicon diodes are adopted as the diodes 60 and 61, which are protection elements. This embodiment is characterized in that Schottky level shift diodes are adopted. More specifically, this embodiment proposes a configuration, according to which voltage transmitting means is changed from polysilicon diodes having reverse characteristics of a PN junction to Schottky level shift diodes having forward characteristics of a Schottky diode.

Figure 6:
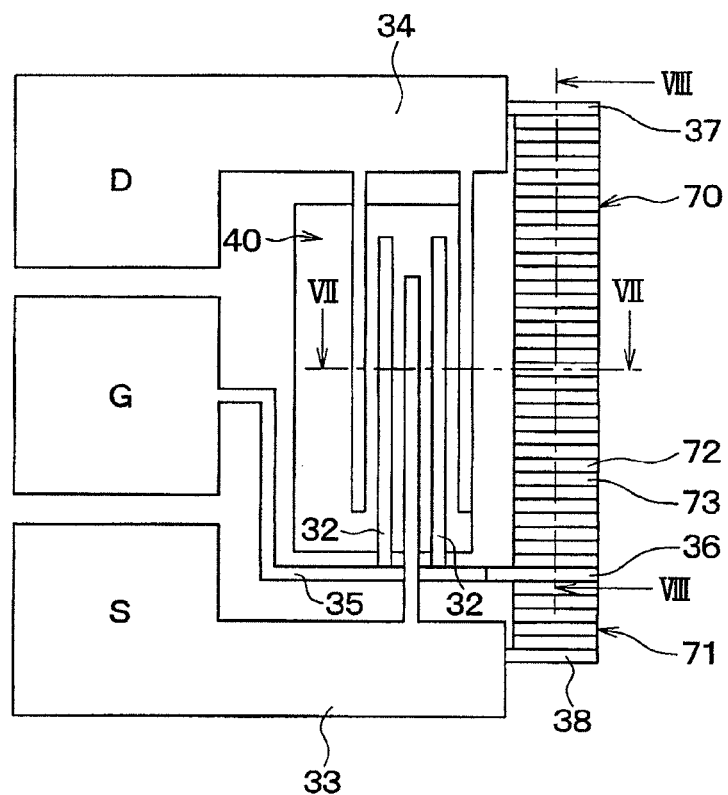
FIG. 6 is a plan view of a semiconductor device of a fourth embodiment.
Figure 7:
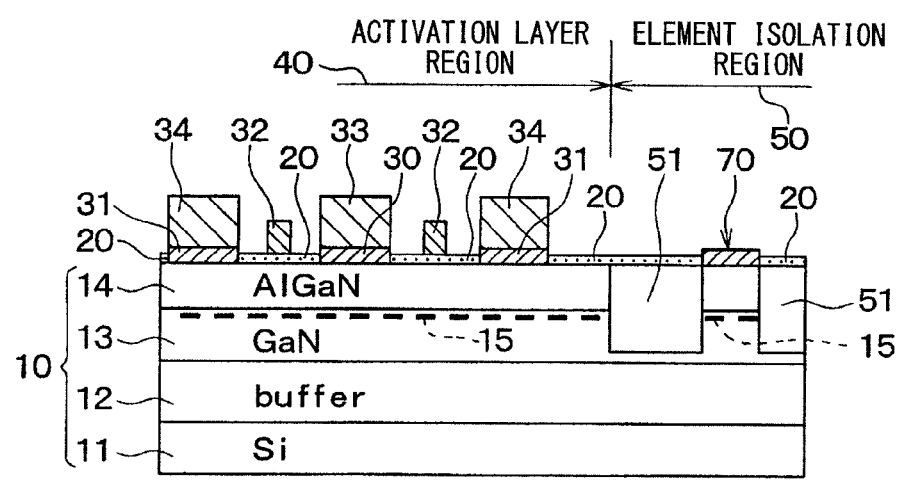
FIG. 7 is a cross section taken along the line VII-VII of FIG. 6.
Figure 8:
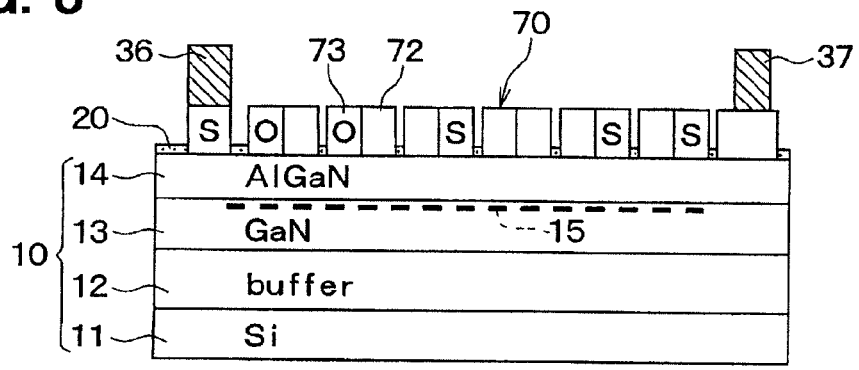
FIG. 8 is a cross section taken along the line VIII-VIII of FIG. 6.

FIG. 6 is a plan view of a semiconductor device of this embodiment. Also, FIG. 7 is a cross section taken on the line of FIG. 6 and FIG. 8 is a cross section taken on the line VIII-VIII of FIG. 6. A configuration of the semiconductor device of this embodiment will be described with reference to FIG. 6 through FIG. 8.

As is shown in FIG. 6, in this embodiment, the anode of a gate-drain diode 70 is connected to the first lead line 36 and the cathode is connected to the second lead line 37. Also, the anode of a gate-source diode 71 is connected to the third lead line 38 and the cathode is connected to the first lead line 36.

The layout of the source electrode 30, the drain electrodes 31, the gate electrodes, and the respective lead lines is the same as that described in the first embodiment above.

As is shown in FIG. 7, the element isolation region 50 formed by ion implantation to the substrate 10 is electrically isolated from the activation layer region 40 in this embodiment as in the first embodiment above. The respective diodes 70 and 71 described above are disposed in this element isolation region 50.

Also, the Schottky diode uses the two dimensional electron gas layer 15, which is a 2DEG. Hence, as is shown in FIG. 7, ion implantation is not applied to the element isolation region 50 entirely and ion implantation is performed to the element isolation region 50 in a region except for a projected portion of the diodes 70 and 71 with respect to the substrate 10. Also, ion implantation is performed deeper than the two dimensional electron gas layer 15 in the GaN layer 13 as in the first embodiment above. Hence, an element isolation layer 51 is formed in the GaN layer 13 and the AlGaN layer 14 where ion implantation is performed in the element isolation region 50.

Also, as is shown in FIG. 8, each of the diodes 70 and 71 is formed as a Schottky level shift diode formed of Schottky electrodes 72 (indicated by a capital S in FIG. 8) and ohmic electrodes 73 (indicted by a capital O in FIG. 8). The Schottky electrodes 72 and the ohmic electrodes 73 are formed directly on the surface of the substrate 10, that is, on the surface of the AlGaN layer 14. In order to ensure a withstand voltage of the respective diodes 70 and 71, the Schottky electrodes 72 and the ohmic electrodes 73 are disposed alternately in a repetitive manner.

As has been described in the first embodiment above, in the case of a GaN-HEMT having a withstand voltage of 600 V, it is assumed that Schottky diodes turn ON with a voltage of 500 V. The voltage is transmitted by the lamination of a forward voltage (Vf) at the Schottky gate. Herein, given Vf=about 2 V, a Schottky level shift diode having 250 steps is required to transfer 500 V.

The semiconductor device configured as above can be manufactured by the method same as that of the first embodiment above. Differences are that ion implantation is performed to the element isolation region 50 except for a region in which to dispose the respective diodes 70 and 71 and that the inter-layer insulating film 20 at a position at which to dispose the respective diodes 70 and 71 in the element isolation region 50 is removed.

As has been described above, Schottky level shift diodes can be adopted as protection elements.

Fifth Embodiment

In this embodiment, a difference from the fourth embodiment above will be described. This embodiment is characterized in that mesa etching is applied to the element isolation region 50 in a configuration in which Schottky level shift diodes are adopted as the diodes 70 and 71.

Figure 9:
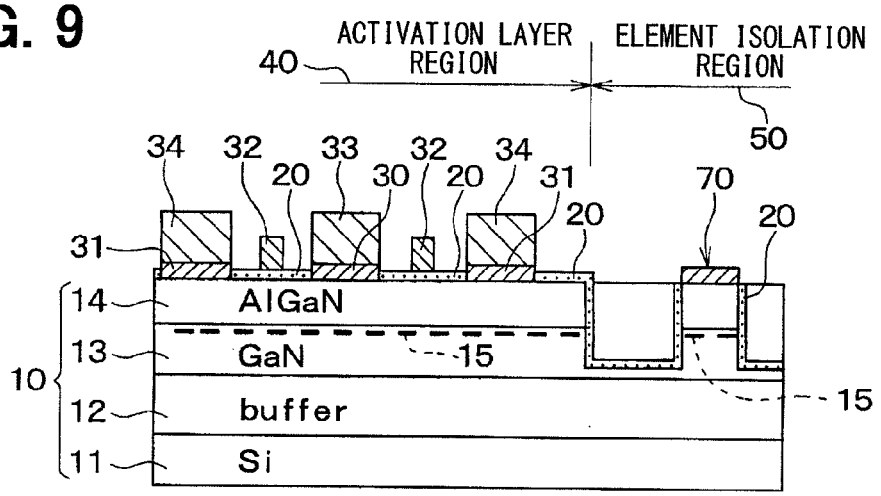
FIG. 9 is a cross section of a semiconductor device of a fifth embodiment.

FIG. 9 is a cross section of a semiconductor device of this embodiment and it is a view corresponding to the cross section taken along the line of FIG. 1. As is shown in this drawing, in the element isolation region 50, mesa etching is applied to a part of the GaN layer 13 and the AlGaN layer 14 in the element isolation region 50.

As is shown in FIG. 9, it should be noted that mesa etching is not applied entirely to the GaN layer 13 and the AlGaN layer 14 positioned in the element isolation region 50 of the substrate 10 and mesa etching is applied to the element isolation region 50 in a region except for a projected portion of the diodes 70 and 71 with respect to the substrate 10. The reason for this configuration is that the Schottky diodes use the two dimensional electron gas layer 15, which is a 2DEG, as described above.

In this manner, even in the configuration in which Schottky level shift diodes are adopted as the diodes 70 and 71, it becomes possible to electrically isolate the element isolation region 50 from the activation layer region 40 by applying mesa etching to the element isolation region 50.

Other Embodiments

It should be understood that the configurations of the respective embodiments above have been described by way of example and the present disclosure is not limited to the configurations described above and may include other configurations that can realize the present disclosure. For example, in the respective embodiments above, a Ti/Al layer is adopted as a material of the lead lines, such as the source lead line 33 and the first lead line 36. It should be appreciated that this configuration is a mere example and other conducting substances can be adopted as well. Also, in the respective embodiments above, an aluminum gallium nitride layer having a lower Al ratio than the barrier layer may be used as the channel layer of the GaN-HEMT structure and an aluminum indium nitride layer may be used as the barrier layer. Further, a single crystal Si substrate is used as the supporting substrate 11 forming the substrate 10. It should be appreciated, however, that other substrates, such as a sapphire substrate and an SiC substrate, may be used as well.

The disclosure above includes the following configurations.

According to a first aspect of the present disclosure, a semiconductor device includes: a high electron mobility transistor; and a diode. The high electron mobility transistor includes a substrate having a gallium nitride layer for generating a two-dimensional electron gas therein and for functioning as a channel layer and an aluminum gallium nitride layer stacked on the gallium nitride layer and functioning as a barrier layer, a source electrode arranged on the aluminum gallium nitride layer and ohmic contacting the aluminum gallium nitride layer, a drain electrode arranged on the aluminum gallium nitride layer apart from the source electrode, and ohmic contacting the aluminum gallium nitride layer, an inter-layer insulating film disposed on the aluminum gallium nitride layer between the source electrode and the drain electrode, and a gate electrode disposed on the inter-layer insulating film. The substrate includes an activation layer region for generating the two-dimensional electron gas in the gallium nitride layer. The diode includes an anode electrically connected to the gate electrode and a cathode electrically connected to the drain electrode. The diode provides a gate-drain diode.

In the semiconductor device described above, a voltage of the drain electrode can be transmitted to the gate electrode by the gate-drain diode. Hence, energy can be flown through a channel in a high electron mobility transistor based on gallium nitride. It thus becomes possible to protect the high electron mobility transistor based on gallium nitride by the diode.

Alternatively, the substrate may include an element isolation region electrically isolated from the activation layer region. The diode is disposed in the element isolation region. In this case, of the substrate, the diode is disposed in the element isolation region different from a region in which the high electron mobility transistor operates. It thus becomes possible to obtain a structure in which a single substrate includes both of a high electron mobility transistor based on gallium nitride and a diode. In this manner, it becomes possible to obtain a structure in which a diode is incorporated into a high electron mobility transistor based on gallium nitride.

Alternatively, the gallium nitride layer and the aluminum gallium nitride layer in the element isolation region may include an ion implantation region. The element isolation region is electrically isolated from the activation layer region by the ion implantation region.

Alternatively, the gallium nitride layer and the aluminum gallium nitride layer in the element isolation region may have a mesa etching region. The element isolation region is electrically isolated from the activation layer region by the mesa etching region.

Alternatively, the substrate may further include a support substrate. In the element isolation region, the substrate includes only the support substrate without including the gallium nitride layer and the aluminum gallium nitride layer. The element isolation region is electrically isolated from the activation layer region due to an absence of the gallium nitride layer and the aluminum gallium nitride layer.

Alternatively, the element isolation region may further include the inter-layer insulating film disposed on the aluminum gallium nitride layer. The diode is disposed on the inter-layer insulating film. In this case, because the diode is not on the substrate in direct contact with the substrate, it becomes possible to suppress a material forming the diode from diffusing into the substrate.

Alternatively, the diode may be made of polysilicon, and includes a first conductivity type layer and a second conductivity type layer electrically connected to each other. In this case, even when the diode is made of polysilicon, diffusion of silicon into the gallium nitride layer or the aluminum gallium nitride layer can be prevented by the inter-layer insulating film during impurity activation of polysilicon. Hence, the diode can be made of polysilicon.

Alternatively, the diode may be a Schottky level shift diode having a Schottky electrode and an ohmic electrode. In this manner, a diode having forward characteristics of a Schottky diode can be a protection element.

Alternatively, the semiconductor device may further include: a gate lead line connected to the gate electrode; a drain lead line connected to the drain electrode; a first lead line connecting an anode of the diode and the gate lead line; and a second lead line connecting a cathode of the diode and the drain lead line. Herein, instead of directly routing a part of the source electrode and the drain electrode, which are ohmic metal, as a line to the gate-drain diode, the lead lines are used in this manner. It thus becomes possible to prevent a material forming the gate-drain diode and a material forming the source electrode and the drain electrode from turning to silicide.

Alternatively, the semiconductor device may further include a gate-source diode. The gate-source diode includes an anode electrically connected to the source electrode and a cathode electrically connected to the gate electrode. Further, the substrate may include an element isolation region electrically isolated from the activation layer region. The gate-source diode is disposed in the element isolation region. Further, the semiconductor device may further include: a gate lead line connected to the gate electrode; a source lead line connected to the source electrode; a first lead line connecting the cathode of the gate-source diode and the gate lead line; and a third lead line connecting the anode of the gate-source diode and the source lead line. Herein, instead of directly routing a part of the source electrode and the drain electrode, which are ohmic metal, as a line to the gate-source diode, the lead lines are used in this manner. It thus becomes possible to prevent a material forming the gate-source diode and a material forming the source electrode and the drain electrode from turning to silicide.

According to a second aspect of the present disclosure, a manufacturing method of the semiconductor device according to the first aspect of the present disclosure includes: preparing the substrate; forming an element isolation region electrically isolated from the activation layer region at least in a part of the substrate other than the activation layer region; forming the high electron mobility transistor in the activation layer region of the substrate; and forming a gate-drain diode having an anode connected to the gate electrode and a cathode connected to the drain electrode in the element isolation region.

With the manufacturing method described above, it becomes possible to obtain a semiconductor device in which a diode is incorporated in a high electron mobility transistor based on gallium nitride.

Alternatively, in the forming of the element isolation region, the element isolation region may be formed by implanting an ion into the gallium nitride layer and the aluminum gallium nitride layer in the element isolation region of the substrate.

Alternatively, in the forming of the element isolation region, the element isolation region may be formed by mesa-etching the gallium nitride layer and the aluminum gallium nitride layer in the element isolation region of the substrate.

Alternatively, the substrate further includes a support substrate. In the forming of the element isolation region, the gallium nitride layer and the aluminum gallium nitride layer in the element isolation region of the substrate are removed entirely. The element isolation region is electrically isolated from the activation layer region due to absence of the gallium nitride layer and the aluminum gallium nitride layer.

Alternatively, the forming of the element isolation region may include forming the inter-layer insulating film on the aluminum gallium nitride layer. In the forming of the gate-drain diode, the gate-drain diode is formed on the inter-layer insulating film. Owing to this configuration, the diode can be formed on the substrate so as not to be in direct contact with the substrate. It thus becomes possible to suppress a material forming the diode from diffusing into the substrate.

Alternatively, in the forming of the gate-drain diode, a polysilicon diode having a first conductivity type layer and a second conductivity type layer of polysilicon may be formed.

Alternatively, in the forming of the gate-drain diode, a Schottky level shift diode having a Schottky electrode and an ohmic electrode may be formed.

Alternatively, the manufacturing method of the semiconductor device may further include, after the gate-drain diode is formed, forming a gate lead line connected to the gate electrode, a drain lead line connected to the drain electrode, a first lead line connecting an anode of the gate-drain diode and the gate lead line, and a second lead line connecting a cathode of the gate-drain diode and the drain lead line. Owing to this configuration, it becomes possible to form the lead lines while preventing a material forming the gate-drain diode and a material forming the source electrode and the drain electrode from turning into silicide.

Alternatively, in the forming of the gate-drain diode, a gate-source diode having an anode connected to the source electrode and a cathode connected to the gate electrode may be further formed in the element isolation region.

Alternatively, the forming of the gate-source diode may further include forming a gate lead line connected to the gate electrode, a source lead line connected to the source electrode, a first lead line connecting a cathode of the gate-source diode and the gate lead line, and a third lead line connecting an anode of the gate-source diode and the source lead line. Owing to this configuration, it becomes possible to form the lead lines while preventing a material forming the gate-source diode and a material forming the source electrode and the drain electrode from turning into silicide.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
a high electron mobility transistor; and
a diode, wherein:
the high electron mobility transistor includes
a substrate having a gallium nitride layer for generating a two-dimensional electron gas therein and for functioning as a channel layer and an aluminum gallium nitride layer stacked on the gallium nitride layer and functioning as a barrier layer,
a source electrode arranged on the aluminum gallium nitride layer and ohmic contacting the aluminum gallium nitride layer,
a drain electrode arranged on the aluminum gallium nitride layer apart from the source electrode, and ohmic contacting the aluminum gallium nitride layer,
an inter-layer insulating film disposed on the aluminum gallium nitride layer between the source electrode and the drain electrode, and
a gate electrode disposed on the inter-layer insulating film;
the substrate includes an activation layer region for generating the two-dimensional electron gas in the gallium nitride layer;
the diode includes an anode electrically connected to the gate electrode of the high electron mobility transistor and a cathode electrically connected to the drain electrode of the high electron mobility transistor; and
the diode is a gate-drain diode;
the substrate further includes an element isolation region electrically isolated from the activation layer region; and
the diode is disposed entirely in the element isolation region,
wherein
the cathode of the diode is connected to the drain electrode of the high electron mobility transistor without passing through the source electrode of the high electron mobility transistor;
wherein
the source electrode has a comb-tooth plan shape; and
the drain electrode has a comb-tooth plan shape,
wherein
a longitudinal direction of the comb-tooth plan shape in the source electrode is in parallel to an extending direction of the diode; and
a longitudinal direction of the comb-tooth plan shape in the drain electrode is in parallel to the extending direction of the diode.

2. The semiconductor device according to claim 1, wherein:
the gallium nitride layer and the aluminum gallium nitride layer in the element isolation region include an ion implantation region; and
the element isolation region is electrically isolated from the activation layer region by the ion implantation region.

3. The semiconductor device according to claim 1, wherein:
the gallium nitride layer and the aluminum gallium nitride layer in the element isolation region have a mesa etching region; and
the element isolation region is electrically isolated from the activation layer region by the mesa etching region.

4. The semiconductor device according to claim 1, wherein:
the substrate further includes a support substrate;
in the element isolation region, the substrate includes only the support substrate without including the gallium nitride layer and the aluminum gallium nitride layer; and
the element isolation region is electrically isolated from the activation layer region due to an absence of the gallium nitride layer and the aluminum gallium nitride layer.

5. The semiconductor device according to claim 1, wherein:
the element isolation region further includes the inter-layer insulating film disposed on the aluminum gallium nitride layer; and
the diode is disposed on the inter-layer insulating film.

6. The semiconductor device according to claim 5, wherein:
the diode is made of polysilicon, and includes a first conductivity type layer and a second conductivity type layer electrically connected to each other.

7. The semiconductor device according to claim 1, wherein:
the diode is a Schottky level shift diode having a Schottky electrode and an ohmic electrode.

8. The semiconductor device according to claim 1, further comprising:
a gate lead line connected to the gate electrode;
a drain lead line connected to the drain electrode;
a first lead line connecting an anode of the diode and the gate lead line; and
a second lead line connecting a cathode of the diode and the drain lead line.

9. The semiconductor device according to claim 1, further comprising:
a gate-source diode,
wherein the gate-source diode includes an anode electrically connected to the source electrode and a cathode electrically connected to the gate electrode.

10. The semiconductor device according to claim 9, wherein:
the substrate includes an element isolation region electrically isolated from the activation layer region; and
the gate-source diode is disposed in the element isolation region.

11. The semiconductor device according to claim 9, further comprising:
a gate lead line connected to the gate electrode;
a source lead line connected to the source electrode;
a first lead line connecting the cathode of the gate-source diode and the gate lead line; and
a third lead line connecting the anode of the gate-source diode and the source lead line.

12. The semiconductor device according to claim 1, wherein:
the cathode of the diode is directly connected to the drain electrode of the high electron mobility transistor; and
the anode of the diode is directly connected to the gate electrode of the high electron mobility transistor.

13. The semiconductor device according to claim 12, wherein:
the diode includes a plurality of N-type layers and a plurality of P-type layers, which are alternately arranged on the substrate.

14. The semiconductor device according to claim 13, wherein:
   the diode is a Zener diode between the gate electrode and the drain electrode in the high electron mobility transistor.

15. The semiconductor device according to claim 1, wherein:
   the gate electrode has a comb-tooth plan shape; and
   a longitudinal direction of the comb-tooth plan shape in the gate electrode is in parallel to the extending direction of the diode.

16. The semiconductor device according to claim 15, wherein:
   the anode of the diode includes a plurality of anode electrodes;
   the cathode of the diode includes a plurality of cathode electrodes; and
   the plurality of anode electrodes and the plurality of cathode electrodes are alternatively arranged on the substrate.

17. The semiconductor device according to claim 16, wherein:
   the extending direction of the diode is an alternative arrangement direction of the plurality of anode electrodes and the plurality of cathode electrodes.

18. The semiconductor device according to claim 15, wherein:
   a comb tooth of the comb-tooth plan shape in the source electrode, a comb tooth of the comb-tooth plan shape in the drain electrode, and a comb tooth of the comb-tooth plan shape in the gate electrode are alternately arranged on the substrate.

\* \* \* \* \*